United States Patent
Choi et al.

(10) Patent No.: US 7,545,094 B2
(45) Date of Patent: Jun. 9, 2009

(54) ORGANIC LIGHT EMITTING DISPLAY WITH FRIT SEAL

(75) Inventors: Dong-Soo Choi, Suwon-si (KR); Jin-Woo Park, Suwon-si (KR); Tae-Seung Kim, Suwon-si (KR)

(73) Assignee: Samsung SDI Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/529,948

(22) Filed: Sep. 29, 2006

(65) Prior Publication Data

US 2007/0090759 A1 Apr. 26, 2007

(30) Foreign Application Priority Data

Oct. 21, 2005 (KR) .................. 10-2005-0099838

(51) Int. Cl.
*H05B 33/04* (2006.01)
*H05B 33/10* (2006.01)

(52) U.S. Cl. ........................ 313/504; 313/506

(58) Field of Classification Search ......... 313/498–512, 313/12, 82, 504–506; 428/690
See application file for complete search history.

(56) References Cited

U.S. PATENT DOCUMENTS

| | | | |
|---|---|---|---|
| 4,238,704 A | | 12/1980 | Bonk et al. |
| 5,882,761 A | | 3/1999 | Kawami et al. |
| 6,226,890 B1 | | 5/2001 | Boroson et al. |
| 6,437,769 B1 | * | 8/2002 | Kobayashi et al. ......... 345/102 |
| 6,538,375 B1 | * | 3/2003 | Duggal et al. .............. 313/506 |
| 6,555,025 B1 | | 4/2003 | Krupetsky et al. |
| 6,570,325 B2 | | 5/2003 | Graff et al. |
| 6,580,223 B2 | * | 6/2003 | Konishi et al. .......... 315/169.3 |
| 6,686,063 B2 | | 2/2004 | Kobayashi |
| 6,723,192 B2 | * | 4/2004 | Nagano et al. ........... 156/89.12 |
| 6,750,606 B2 | * | 6/2004 | Kenmotsu ................... 313/495 |
| 6,833,668 B1 | * | 12/2004 | Yamada et al. .............. 313/505 |
| 6,853,126 B2 | * | 2/2005 | Nomura ..................... 313/492 |
| 6,992,330 B2 | | 1/2006 | Fery et al. |
| 6,998,776 B2 | * | 2/2006 | Aitken et al. ................ 313/512 |
| 7,063,902 B2 | * | 6/2006 | Kikuchi et al. .............. 428/690 |
| 2003/0076039 A1 | * | 4/2003 | Ookawa et al. .............. 313/587 |

(Continued)

FOREIGN PATENT DOCUMENTS

CN 1311976 9/2001

(Continued)

OTHER PUBLICATIONS

An Office Action from a corresponding Korean patent application in 2 pages.

*Primary Examiner*—Nimeshkumar D. Patel
*Assistant Examiner*—Anne M Hines
(74) *Attorney, Agent, or Firm*—Knobbe Martens Olson & Bear (57) ABSTRACT

An organic light emitting display device includes a first substrate, an array of organic light emitting pixels formed on the substrate, a second substrate opposing the first substrate. A frit seal interconnects the first and second substrates and surrounds the array of organic light emitting pixels. A film structure interposed between the second substrate and the array of organic light emitting pixels and contacts both the second substrate and the array.

15 Claims, 7 Drawing Sheets

U.S. PATENT DOCUMENTS

| | | |
|---|---|---|
| 2004/0069017 A1* | 4/2004 | Li et al. ............... 65/43 |
| 2004/0150332 A1 | 8/2004 | Hwang et al. |
| 2005/0233885 A1 | 10/2005 | Yoshida et al. |
| 2005/0248270 A1* | 11/2005 | Ghosh et al. ........... 313/512 |
| 2005/0275342 A1 | 12/2005 | Yanagawa |
| 2007/0013292 A1 | 1/2007 | Inoue et al. |
| 2007/0152212 A1 | 7/2007 | Cho et al. |

FOREIGN PATENT DOCUMENTS

| | | |
|---|---|---|
| JP | 09-050250 A | 2/1997 |
| JP | 09-134781 A | 5/1997 |
| JP | 09-148066 A | 6/1997 |
| JP | JP 09-278483 | 10/1997 |
| JP | JP 10-074583 | 3/1998 |
| JP | 11-329717 A | 11/1999 |
| JP | 2000-100561 A | 4/2000 |
| JP | 2003-109750 A | 4/2003 |
| JP | 2004-265615 A | 9/2004 |
| KR | 10-2003-0096517 A | 12/2003 |
| KR | 10-2004-0001064 A | 1/2004 |
| KR | 10-2004-0073695 A | 8/2004 |
| KR | 10-2005-0024592 | 3/2005 |
| KR | 10-2005-0024592 A | 3/2005 |
| KR | 10-2005-0031659 A | 4/2005 |

* cited by examiner

ORGANIC LIGHT EMITTING DISPLAY WITH FRIT SEAL

CROSS-REFERENCE TO RELATED APPLICATION

This application claims priority to and the benefit of Korean Patent Application No. 10-2005-0099838, filed Oct. 21, 2005, which is incorporated herein by reference in its entirety. This application is related to and incorporates herein by reference the entire contents of the following concurrently filed application:

| Title | Filing Date | Application No. |
|---|---|---|
| ORGANIC LIGHT EMITTING DISPLAY DEVICE AND METHOD OF FABRICATING THE SAME | Sep. 29, 2006 | 11/529,884 |

BACKGROUND

1. Field of the Invention

The present invention relates to an organic light emitting display device, and more particularly, to encapsulating the organic light emitting display device.

2. Description of Related Art

Generally, an organic light emitting display (OLED) includes an anode electrode layer, a hole transport layer, an organic emission layer, and an electron transport layer, which are sequentially formed on the anode electrode layer, and a cathode electrode layer formed on the resultant structure. In such a structure, when a voltage is applied, a hole injected from the anode electrode layer moves to the organic emission layer via the hole transport layer, and an electron injected from the cathode electrode layer moves to the organic emission layer via the electron transport layer, so that carriers of the hole and electron combine in the organic emission layer to create excitons. The organic emission layer emits light by energy generated when the excitons created as described above make the transition from an excited state to a ground state.

Figure 1:
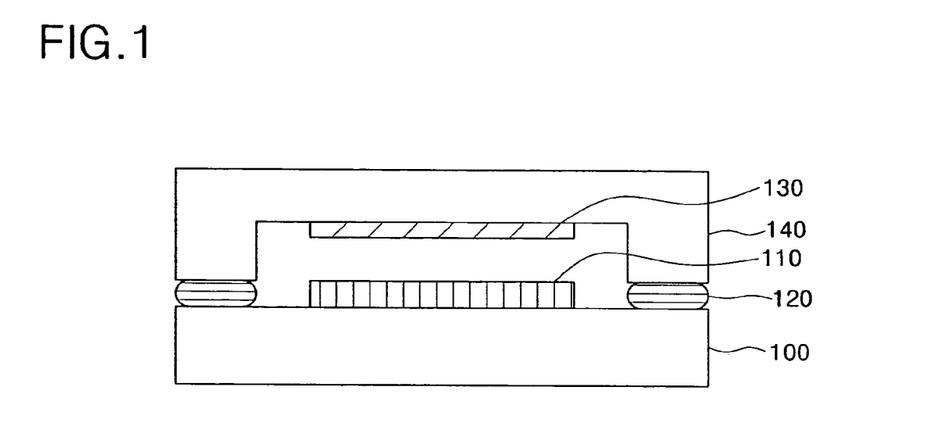
FIG. 1 is a cross-sectional view of an exemplary organic light emitting display.

However, organic thin layers formed of an organic compound having low thermal resistivity is likely to be degraded by moisture, and a cathode electrode formed on the organic thin layers can be lowered in performance due to oxidation. Therefore, the organic thin layers should be hermetically sealed to prevent moisture or oxygen from contacting the thin layers. FIG. 1 is a cross-sectional view of an exemplary organic light emitting display. As shown in FIG. 1, an organic light emitting diode 110 is formed on a substrate 100. The substrate 100 includes a thin film transistor having a semiconductor layer, a gate electrode, a source electrode, and a drain electrode. Then, after forming a moisture absorption layer 130 on one surface of a sealing substrate 140 facing the organic light emitting diode 110, the substrate 100 and the sealing substrate 140 are adhered to each other using a sealant 120, thereby completing an organic light emitting display.

SUMMARY OF CERTAIN INVENTIVE ASPECTS

An aspect of the invention provides an organic light emitting display device, which may comprises: a first substrate; a second substrate comprising an interior surface opposing the first substrate; an array of organic light emitting pixels formed between the first and second substrates, the array comprising a top surface facing the second substrate; a frit seal interposed between the first and second substrates while surrounding the array; and a film structure comprising one or more layered films, the film structure comprising a portion interposed between the second substrate and the array, the film structure contacting the interior surface and the top surface.

In the foregoing device, the film structure may cover substantially the entire portion of the top surface. The film structure may further comprise a portion interposed between the first and second substrates while not interposed between the array and the second substrate. The film structure may contact the frit seal. The film structure may not contact the frit seal. The array may comprise a first electrode, a second electrode and an organic light emitting material interposed between the first and second electrodes, wherein the first electrode may have a first distance from the first substrate, and the second electrode may have a second distance from the first substrate, wherein the second distance may be greater than the first distance, and wherein the top surface may be a surface of the electrode.

Still in the foregoing device, the film structure may comprise an organic resin layer and a protective layer interposed between the array and the organic resin layer, wherein the protective layer may be configured to substantially inhibit components of the organic resin layer from diffusing into the array. The protective layer may comprise at least one selected from the group consisting of silicon oxide and silicon nitride. The organic resin layer may comprise a urethane acrylic resin. The array may emit visible light through the second substrate.

Further in the foregoing device, at least part of the film structure may be substantially transparent with respect to visible light. The film structure may have a reflectance for visible light smaller than or substantially equal to that of the second substrate. The film structure may have a refractory index substantially equal to that of material that forms a layer contacting the film structure. The film structure may be substantially nonconductive. The frit seal may comprise one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

Another aspect of the invention provides a method of making an organic light-emitting display device, which may comprise: providing an unfinished product comprising a first substrate, a second substrate comprising an interior surface opposing the first substrate, a first array of organic light emitting pixels interposed between the first and second substrates, the first array comprising a first top surface facing the second substrate, a first frit interposed between the first and second substrates while surrounding the first array, a second array of organic light emitting pixels interposed between the first and second substrates, the second array comprising a second top surface facing the second substrate, a second frit interposed between the first and second substrates while surrounding the second array, and a first film structure comprising one or more layered films interposed between the first array and the second substrate, the first film structure contacting the interior surface and the first top surface, and at least one film of the first film structure comprising a curable material, a second film structure comprising one or more layered films interposed between the second array and the second substrate, the second film structure contacting the interior surface and the second top surface, and at least one film of the second film structure comprising a curable material; cutting the unfinished product into a first piece and a second piece, wherein the first piece comprises a cut piece of the first substrate, a cut piece of the second substrate, the first array, the first frit and the first film structure, wherein the second piece comprises a cut piece of the first substrate, a cut piece of the second substrate, the second array, the second frit and the second film structure; and curing the curable material.

In the forgoing method, providing the unfinished product may comprise providing the first substrate and the first and second arrays formed over the first substrate, providing the second substrate and the curable material formed over the second substrate; arranging the first and second substrates such that the curable material is located between the first and second substrates; and interposing the first and second frits between the first and second substrates. The curable material may contact the first frit, and wherein curing the curable material may comprise first curing a portion of the curable material in the vicinity of the first frit and then curing the remainder of the curable material. Curing the portion in the vicinity of the first frit may comprise irradiating UV light. Curing the remainder may comprise heating the curable material. The first array may comprise a first electrode, a second electrode and an organic light emitting material interposed between the first and second electrodes, wherein the first electrode may have a first distance from the first substrate, and the second electrode may have a second distance from the first substrate, wherein the second distance may be greater than the first distance, and wherein the top surface is a surface of the electrode.

BRIEF DESCRIPTION OF THE DRAWINGS

The above and other aspects and features of the present invention will be described in reference to certain exemplary embodiments thereof with reference to the attached drawings in which.

DETAILED DESCRIPTION OF EMBODIMENTS

Various embodiments of the present invention will now be described more fully hereinafter with reference to the accompanying drawings, in which embodiments of the invention are shown. In the drawings, the length or thickness of layers and regions may be exaggerated for the sake of illustration.

An organic light emitting display (OLED) is a display device comprising an array of organic light emitting diodes. Organic light emitting diodes are solid state devices which include an organic material and are adapted to generate and emit light when appropriate electrical potentials are applied.

Figure 8A:
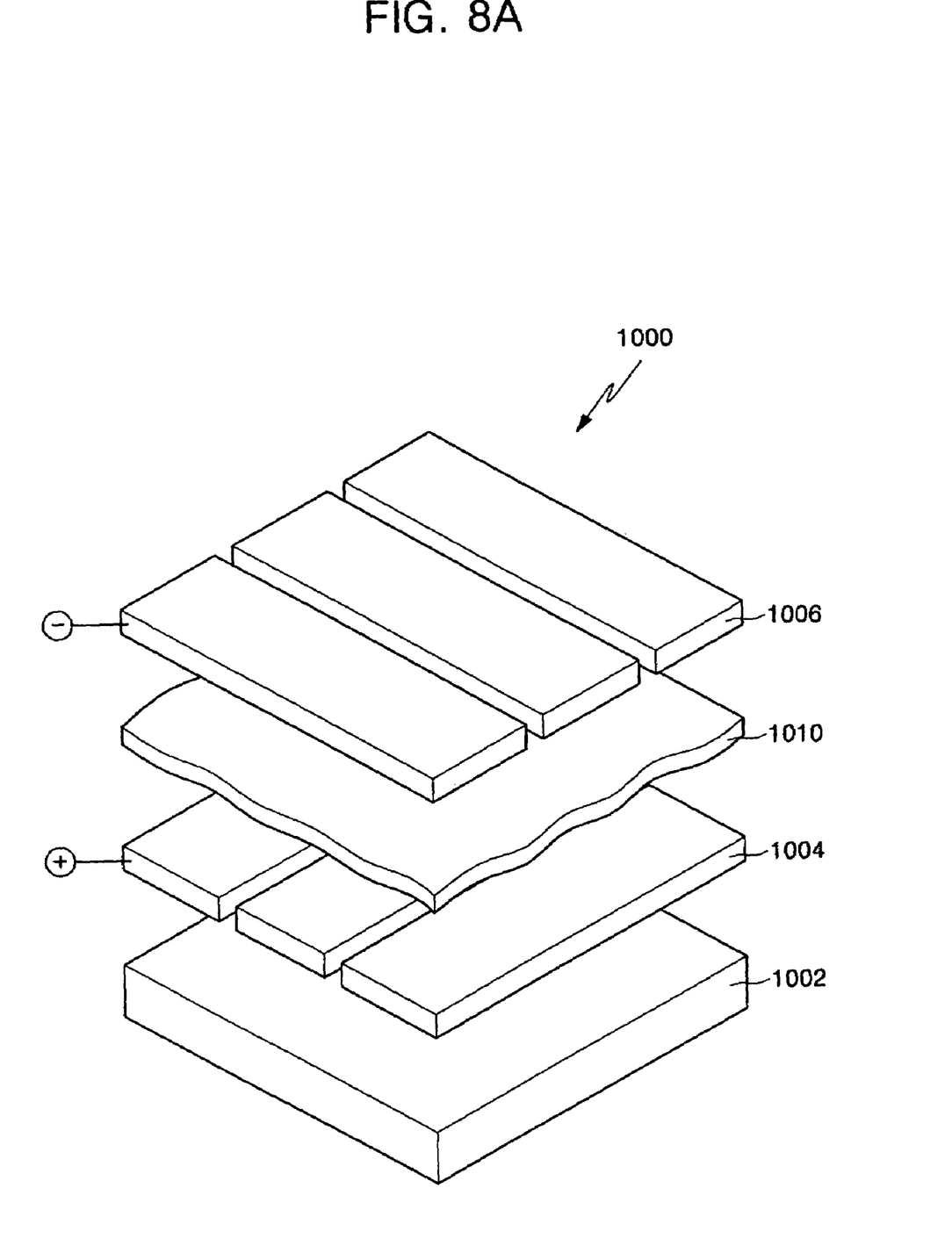
FIG. 8A is a schematic exploded view of a passive matrix type organic light emitting display device in accordance with one embodiment.
Figure 8B:
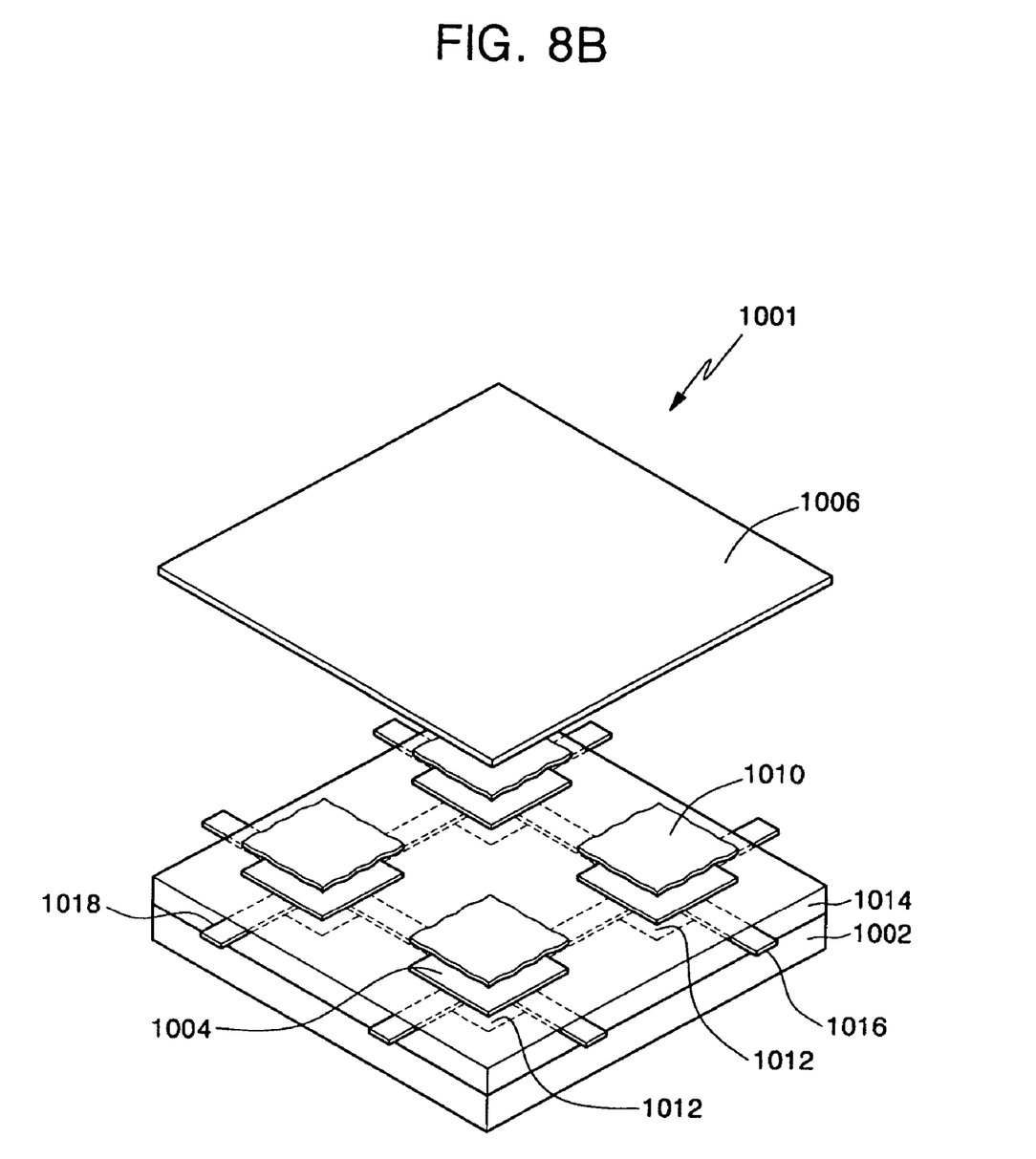
FIG. 8B is a schematic exploded view of an active matrix type organic light emitting display device in accordance with one embodiment.

OLEDs can be generally grouped into two basic types dependent on the arrangement with which the stimulating electrical current is provided. FIG. 8A schematically illustrates an exploded view of a simplified structure of a passive matrix type OLED 1000. FIG. 8B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 8A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 8B, the active matrix OLED (AMOLED) includes driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 8C:
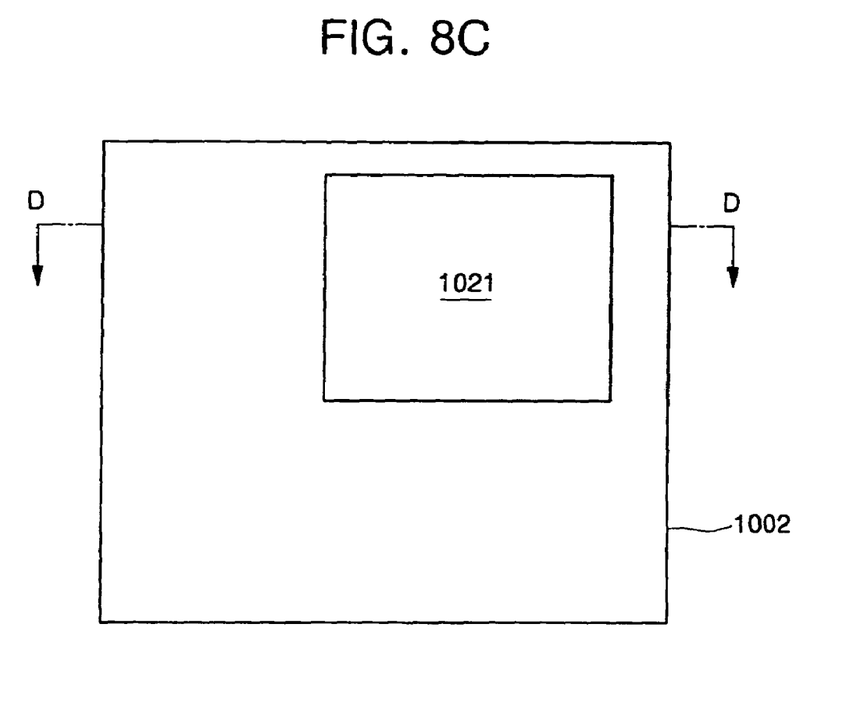
FIG. 8C is a schematic top plan view of an organic light emitting display in accordance with one embodiment.

In many embodiments, an OLED pixel array 1021 comprising a plurality of organic light emitting pixels is arranged over a substrate 1002 as shown in FIG. 8C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 8D:
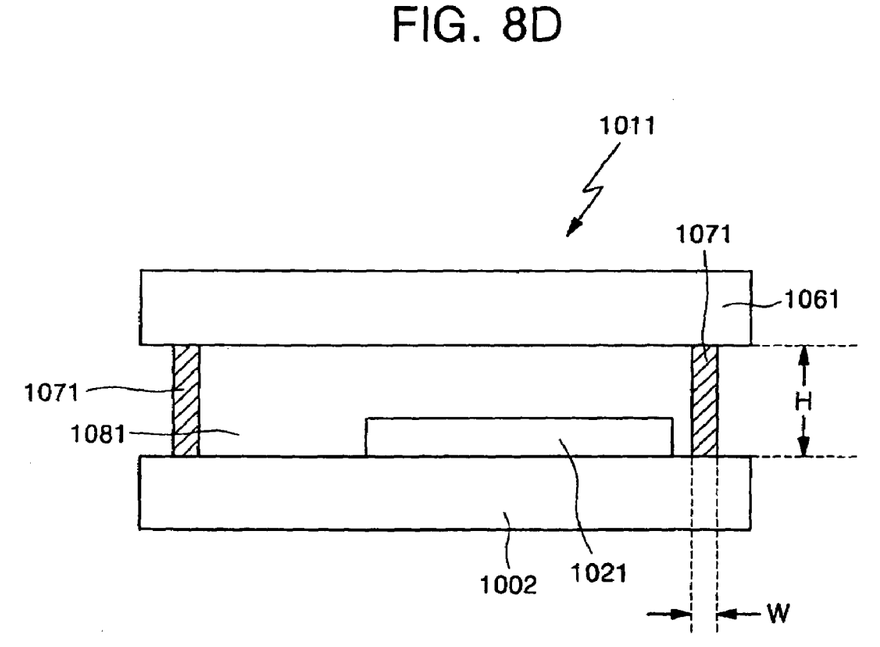
FIG. 8D is a cross-sectional view of the organic light emitting display of FIG. 8C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 8D schematically illustrates a cross-section of an encapsulated OLED device 1011 having a layout of FIG. 8C and taken along the line d-d of FIG. 8C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 8D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 8D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide (Li$_2$O), sodium oxide (Na$_2$O), potassium oxide (K$_2$O), boron oxide (B$_2$O$_3$), vanadium oxide (V$_2$O$_5$), zinc oxide (ZnO), tellurium oxide (TeO$_2$), aluminum oxide (Al$_2$O$_3$), silicon dioxide (SiO$_2$), lead oxide (PbO), tin oxide (SnO), phosphorous oxide (P$_2$O$_5$), ruthenium oxide (Ru$_2$O), rubidium oxide (Rb$_2$O), rhodium oxide (Rh$_2$O), ferrite oxide (Fe$_2$O$_3$), copper oxide (CuO), titanium oxide (TiO$_2$), tungsten oxide (WO$_3$), bismuth oxide (Bi$_2$O$_3$), antimony oxide (Sb$_2$O$_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include ZnSiO$_4$, PbTiO$_3$, ZrO$_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxylpropyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 8E:
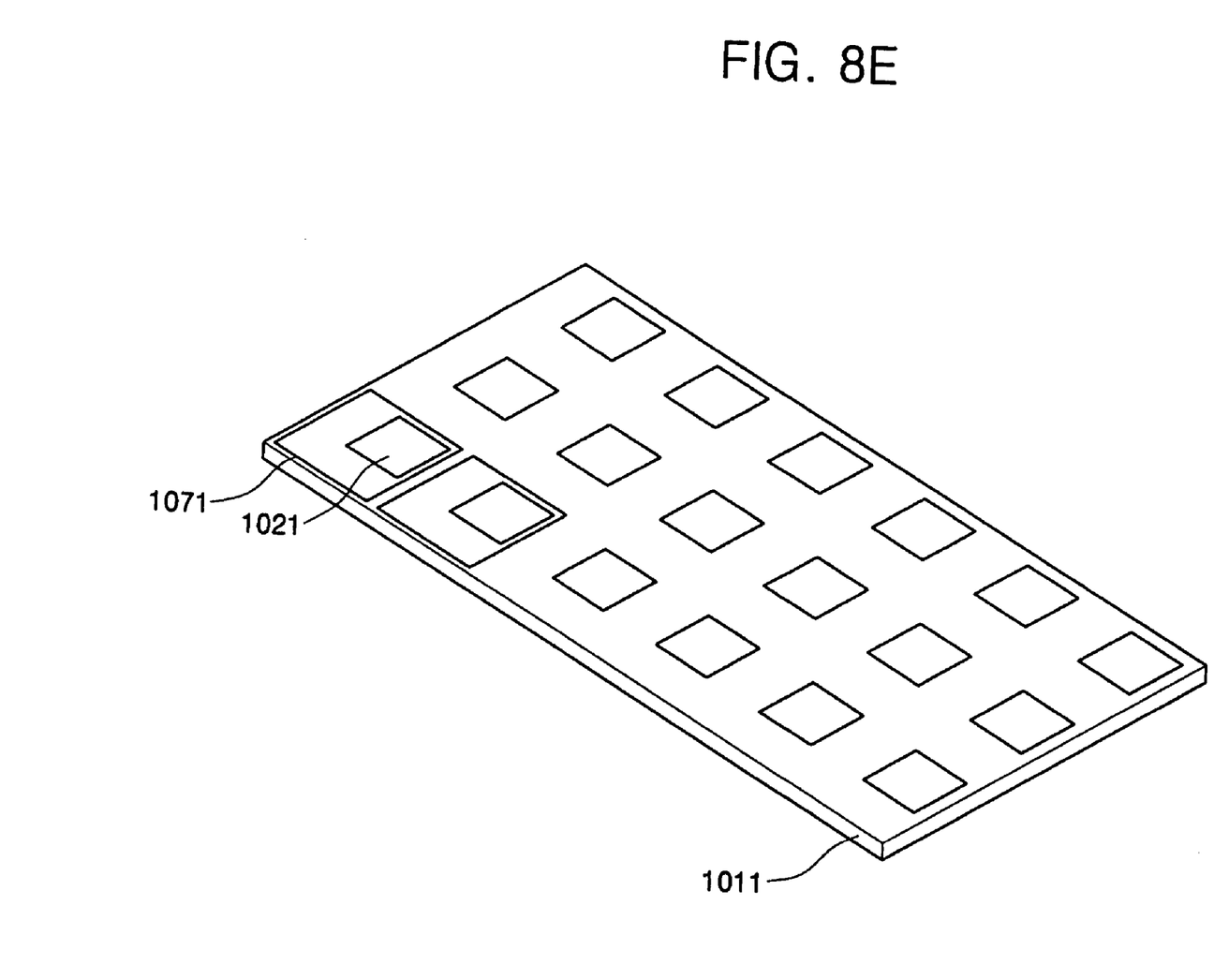
FIG. 8E is a schematic perspective view illustrating mass production of organic light emitting devices in accordance with one embodiment.

In some embodiments, OLED devices 1011 are mass produced. In an embodiment illustrated in FIG. 8E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 10111 of FIG. 8D. In certain embodiments, the individual OLED devices 1011 then further undergo additional packaging operations to further improve the sealing formed by the frit seal 1071 and the top and bottom substrates 1061, 1002.

When an upper (or top) substrate and a lower (or bottom) substrate are formed of glass, the organic light emitting display may show Newton's rings, which are ring-shaped patterns of, such as, an ellipse or a concentric circle that are created due to optical interferences between the light entering from the exterior and certain reflections thereof.

Figure 2:
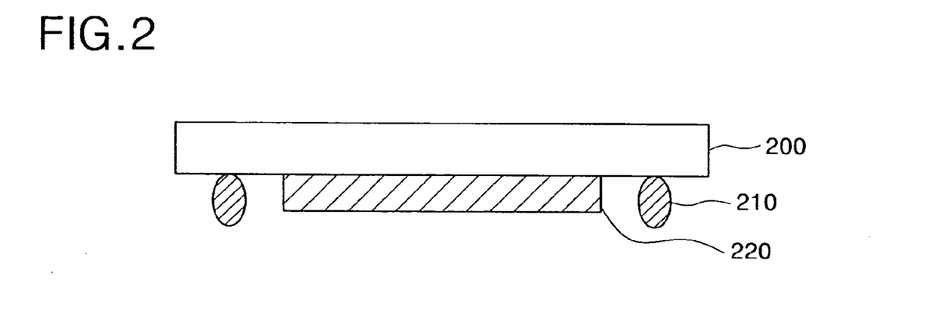
FIGS. 2 and 3 are cross-sectional views of an organic light emitting display in accordance with embodiments of the present invention.
Figure 3:
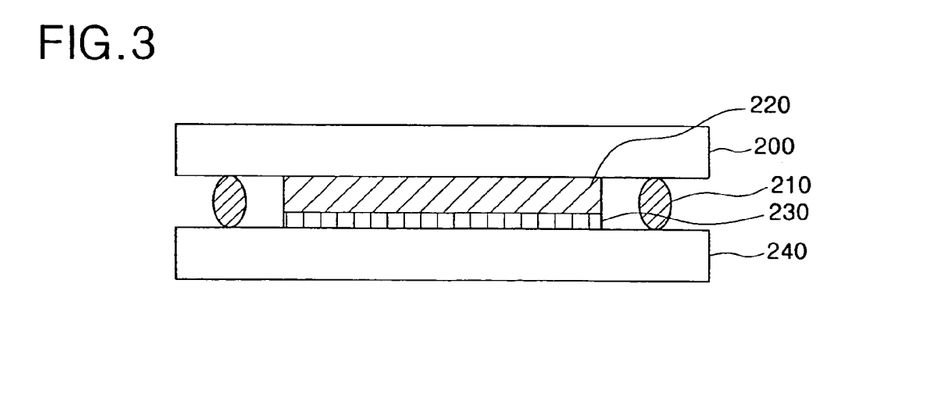

FIGS. 2 and 3 are cross-sectional views of an organic light emitting display in accordance with embodiments of the present invention. Referring to FIG. 2, frits 210 are formed on one surface of a sealing substrate 200, which is equivalent to the top plate 1061. The sealing substrate 200 is formed of an insulating glass substrate, and the frits 210 are formed of a glass frit having strong adhesive force, mechanical strength, and chemical durability. The glass frit is fabricated by melting glass having one selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, and a composite thereof, and pulverizing the glass to form fine powder.

A film 220 is formed between the frits 210. In certain embodiments, the film 220 is formed of urethane acryl capable of reducing optical interference. In an embodiment, the film 220 has a refractive index substantially equal to that of a material that forms a layer contacting the film 220 in order to substantially reduce the optical interference. In one embodiment, the refractory index of the film 220 is from about 90% to 110% of that of the material that forms a layer contacting the film 220. For example, the refractory index of the film 220 is from about 90, 92, 94, 95, 96, 97, 97.5, 98, 98.5, 99, 99.5, 100, 100.5, 101, 101.5, 102, 102.5, 103, 104, 105, 106, 108 and 110% of that of the material that forms a layer contacting the film 220. In an embodiment, the film 220 is adhered to the substrate 200 in a laminated manner.

Next, as shown in FIG. 3, an array of organic light emitting diodes or pixels 230 is formed on a substrate 240, which is equivalent to the bottom plate 1002. In some embodiments, the substrate 240 includes a thin film transistor having a semiconductor layer, a gate electrode, a source electrode, and a drain electrode. The organic light emitting diode or pixel 230 includes at least one of a hole injection layer, a hole transport layer, an organic emission layer, an electron transport layer, and an electron injection layer.

In the illustrated embodiment, the substrate 240 is aligned to the sealing substrate 200 and the frits 210 are thermally cured at a temperature of about 180 to about 350° C. For example, the frits 210 may be irradiated with a laser beam so that the frits 210 are melted and solidified. When the sealing substrate 200 is aligned to the substrate 240, the film 220 formed on one surface of the sealing substrate 200 is in contact with the entire surface of the organic light emitting diode 230 formed on the substrate 240. The film 220 is in contact with one surface of the organic light emitting diode 230 through which light is emitted, thereby reducing generation of the interference pattern.

In the illustrated organic light emitting display, since the substrate is hermetically sealed using a glass frit having strong adhesive force, excellent mechanical strength, and chemical durability, it is possible to protect the organic light emitting diode without a moisture absorption material. In an embodiment, an additional film for reducing optical interference may be attached to remove an interference pattern.

Figure 4:
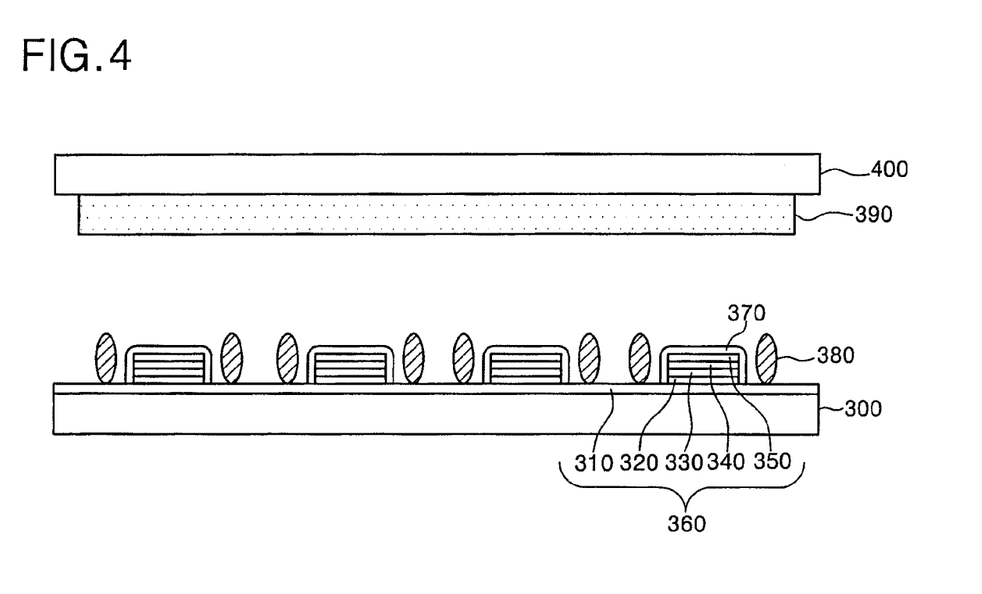
FIGS. 4 to 7 are cross-sectional views of an organic light emitting display in accordance with embodiments of the present invention.

FIGS. 4 to 7 are cross-sectional views of an organic light emitting display in accordance with certain embodiments of the present invention. First, as shown in FIG. 4, a first electrode 310 is formed on a substrate 300, which is equivalent to the bottom plate 1011. The substrate 300 includes a thin film transistor having a semiconductor layer, a gate electrode, a source electrode, and a drain electrode, and the first electrode may be formed of transparent ITO or IZO having a high work function. In an embodiment, an organic light emitting diode or pixel 360 is formed over the first substrate 300. The organic light emitting diode 360 includes the first electrode 310, a hole transport layer 320, an organic emission layer 330, an electron transport layer 340, and a second electrode 350. In an embodiment, an inorganic layer 370 for protecting the organic light emitting diode 360 is formed. The inorganic layer 370 for protecting the organic light emitting diode from a sealant is formed of one transparent material selected from silicon oxides or silicon nitrides.

Next, in the illustrated embodiment, frits 380 are formed to surround the organic light emitting diode 360. Similar to the above described embodiment, the frits 380 are formed of a glass frit having strong adhesive force, mechanical strength, and chemical durability. The glass frit is fabricated by melting glass having one selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, and a composite thereof, and pulverizing the glass to form fine powder.

Then, in an embodiment, a transparent sealant 390 is formed at one surface of a sealing substrate 400 facing the organic light emitting diode 360. The sealant 390 may be formed of urethane acryl capable of reducing optical interference to remove the interference pattern. The urethane acryl has a refractive index substantially equal to that of a material that forms a layer contacting the film 220 in order to reduce optical interference.

Figure 5:
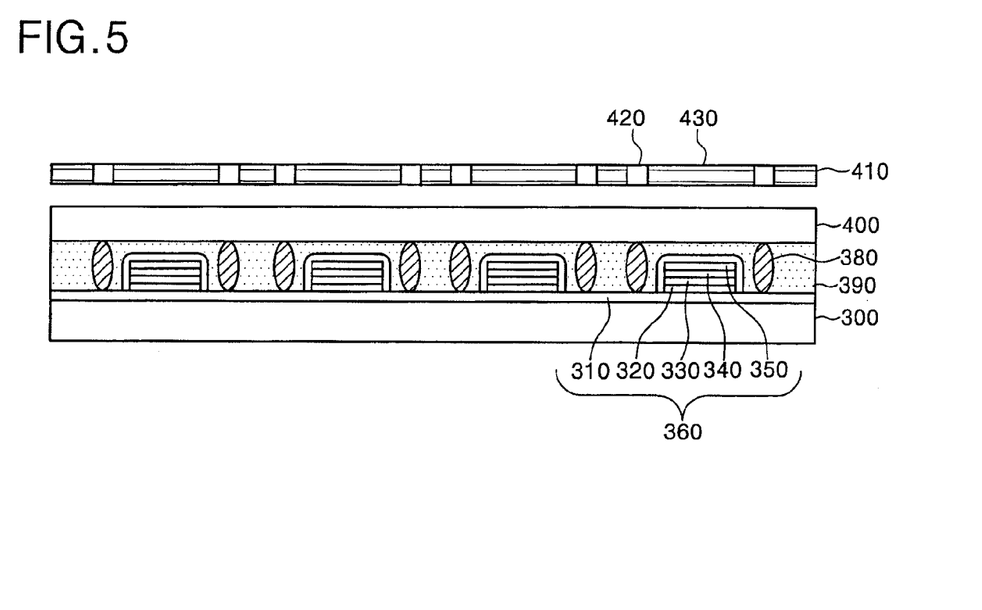
Figure 6:
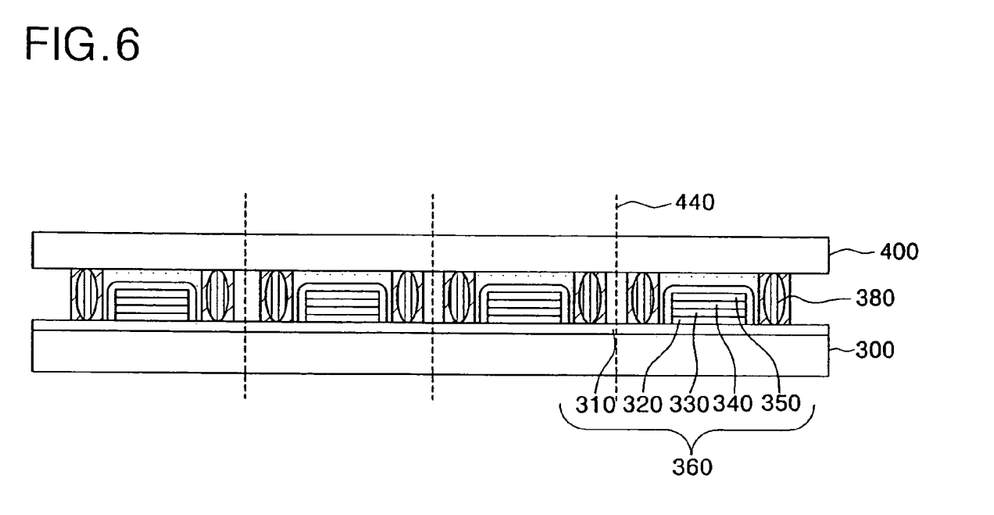
Figure 7:
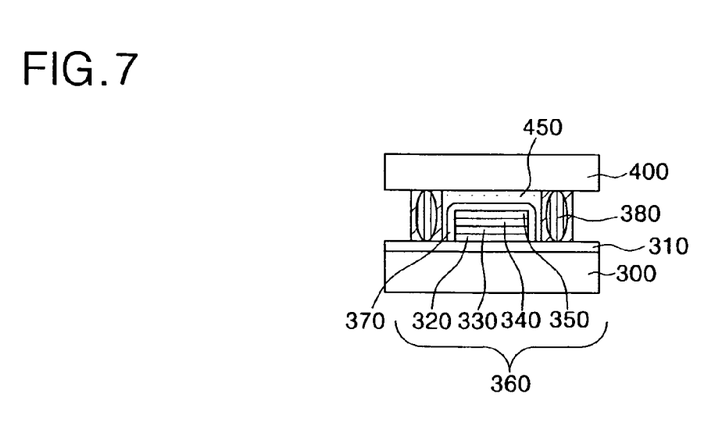

Then, in the illustrated embodiment in FIG. 5, the substrate 300 and the sealing substrate 400 are aligned to each other. In an embodiment, a UV mask 410 is provided to optically and partially cure the sealant 390. The mask has an area 420 which allows UV light to pass and another area 430 which inhibits UV light from passing. Next, in an embodiment in FIG. 6, the sealant formed at the vicinity of the frit 380 is cured by using the UV mask 410, and the sealant formed at the other regions are not cured. Thus, an unfinished product is obtained. The unfinished product is cut along a cutting line 440, and then, in an embodiment, the non-cured sealant around the cutting line 440 is removed. Referring to FIG. 7, the non-cured sealant 450 formed on the organic light emitting diode 360 is thermally cured, thereby completing the organic light emitting display.

In the above organic light emitting display, the substrate is hermetically sealed using a glass frit having strong adhesive force, excellent mechanical strength and chemical durability, thereby providing a better sealing effect. In addition, a sealant for reducing optical interference is used to remove an unwanted interference pattern. Therefore, an organic light emitting display and a method of fabricating the same according to the present invention are capable of providing excellent sealing characteristics, protecting the display from external impact, and removing a glass interference pattern.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting display device comprising:
a first substrate;
a second substrate comprising an interior surface opposing the first substrate;
an array of organic light emitting pixels formed between the first and second substrates, the array comprising a top surface facing the second substrate;
a frit seal interposed between the first and second substrates while surrounding the array, wherein the frit seal comprises an inner surface facing the array; and
a film structure comprising one or more layered films, wherein the film structure comprising a portion interposed between the second substrate and the array, the film structure substantially fills space between the second substrate and the array and further contacts the interior surface and the top surface, wherein the film structure further contacts substantially the entire portion of the inner surface of the frit seal, wherein the film structure contacting the inner surface comprises a resin material, wherein the frit seal further comprises an outer surface facing away from the array, and wherein the same resin material is formed on a portion of the outer surface of the frit seal.

2. The device of claim 1, wherein the film structure covers substantially the entire portion of the top surface.

3. The device of claim 1, wherein the film structure further comprises a portion interposed between the first and second substrates while not interposed between the array and the second substrate.

4. The device of claim 1, wherein the array comprises a first electrode, a second electrode and an organic light emitting material interposed between the first and second electrodes, wherein the first electrode has a first distance from the first substrate, and the second electrode has a second distance from the first substrate, wherein the second distance is greater than the first distance, and wherein the top surface is a surface of the second electrode.

5. The device of claim 1, wherein the film structure comprises an organic resin layer and a protective layer interposed between the array and the organic resin layer, wherein the protective layer is configured to substantially inhibit components of the organic resin layer from diffusing into the array.

6. The device of claim 5, wherein the protective layer comprises at least one selected from the group consisting of silicon oxide and silicon nitride.

7. The device of claim 5, wherein the organic resin layer comprises a urethane acrylic resin.

8. The device of claim 1, wherein the array emits visible light through the second substrate.

9. The device of claim 1, wherein at least part of the film structure is substantially transparent with respect to visible light.

10. The device of claim 1, wherein the film structure has a reflectance for visible light smaller than or substantially equal to that of the second substrate.

11. The device of claim 1, wherein the film structure has a refractive index substantially equal to that of material that forms a layer contacting the film structure.

12. The device of claim 1, wherein the film structure is substantially nonconductive.

13. The device of claim 1, wherein the frit seal comprises one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

14. The device of claim 1, wherein the film structure contacting the inner surface comprises a resin material, wherein the frit seal further comprises an outer surface facing away from the array, wherein the same resin material is formed on substantially the entire portion of the outer surface of the frit seal.

15. The device of claim 1, wherein the first substrate, the second substrate, the array and the frit seal in combination define a space, wherein the space is substantially filled with a solid matter, wherein the solid matter comprising the film structure.

* * * * *